(12) United States Patent
Cai et al.

(10) Patent No.: US 7,985,971 B2
(45) Date of Patent: Jul. 26, 2011

(54) METHOD OF PRODUCING THIN SEMICONDUCTOR STRUCTURES

(75) Inventors: Yong Cai, Shatin (HK); Hung Shen Chu, Shatin (HK); Shengmei Zheng, Shatin (HK); Ka Wah Chan, Shatin (HK)

(73) Assignee: Hong Kong Applied Science and Technology Research Institute Co. Ltd., Hong Kong (HK)

( * ) Notice: Subject to any disclaimer, the term of this patent is extended or adjusted under 35 U.S.C. 154(b) by 210 days.

(21) Appl. No.: 12/415,467

(22) Filed: Mar. 31, 2009

(65) Prior Publication Data

US 2009/0218590 A1 Sep. 3, 2009

Related U.S. Application Data

(63) Continuation-in-part of application No. 11/891,466, filed on Aug. 10, 2007.

(30) Foreign Application Priority Data

Feb. 16, 2007 (CN) .......................... 2007 1 0080281

(51) Int. Cl.
*H01L 27/15* (2006.01)

(52) U.S. Cl. ................ 257/79; 257/81; 257/90; 257/99; 257/103; 257/192; 438/22; 438/28; 438/33; 438/46

(58) Field of Classification Search .......................... None
See application file for complete search history.

(56) References Cited

U.S. PATENT DOCUMENTS

| 6,828,584 B2 * | 12/2004 | Arao et al. ...................... 257/57 |
| 7,125,741 B2 | 10/2006 | Yen et al. |
| 2005/0009345 A1 | 1/2005 | Yen et al. |
| 2007/0126022 A1 | 6/2007 | Baik et al. |
| 2009/0039383 A1 | 2/2009 | Chu et al. |

FOREIGN PATENT DOCUMENTS

| CN | 1510765 A | 7/2004 |
| JP | 2007158334 A | 6/2007 |
| WO | WO-2009/021416 A1 | 2/2009 |

OTHER PUBLICATIONS

International Search Report issued Jan. 7, 2010 in related Application No. PCT/CN2009/071047.

* cited by examiner

*Primary Examiner* — N Drew Richards
*Assistant Examiner* — Kyoung Lee
(74) *Attorney, Agent, or Firm* — Venable LLP; Jeffri A. Kaminski; Christopher Ma

(57) ABSTRACT

A method of making a thin gallium-nitride (GaN)-based semiconductor structure is provided. According to one embodiment of the invention, the method includes the steps of providing a substrate; sequentially forming one or more semiconductor layers on the substrate; etching a pattern in the one or more semiconductor layers; depositing a dielectrics layer; forming a photoresist on a portion of the dielectrics layer, wherein the portion of the dielectrics layer is deposited on the one or more semiconductor layers; depositing a primer; removing the photoresist layer, wherein the primer on the photoresist is also removed; depositing a superhard material, wherein the superhard material forms in the pattern; and removing the substrate. Accordingly, the superhard material may be selectively deposited in only areas where the superhard material is desired. Vertical GaN-based light emitting devices may then be formed by cutting the semiconductor structure.

16 Claims, 11 Drawing Sheets

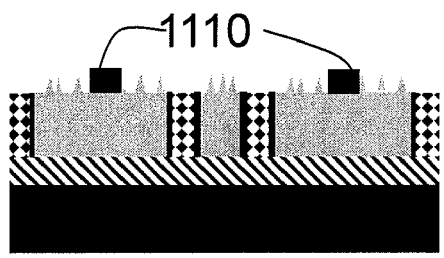
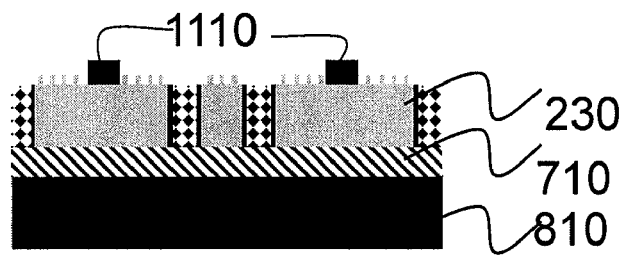
FIG. 10A       FIG. 10B
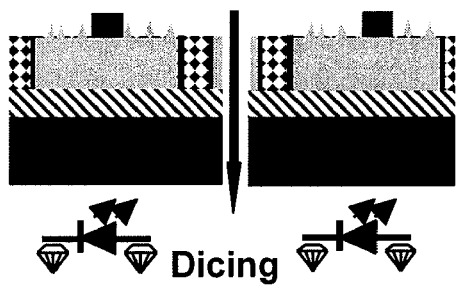
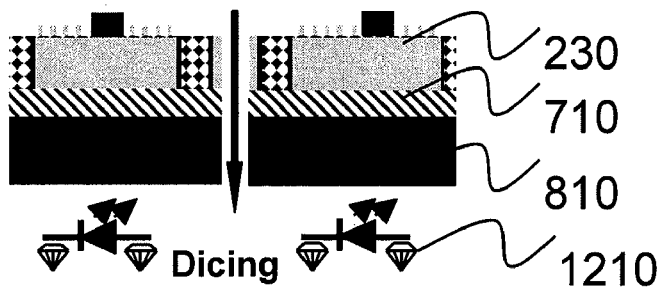
FIG. 11A       FIG. 11B

METHOD OF PRODUCING THIN SEMICONDUCTOR STRUCTURES

CROSS-REFERENCE TO RELATED APPLICATIONS

This application is a continuation-in-part of U.S. patent application Ser. No. 11/891,466, filed on Aug. 10, 2007, the disclosure of which is fully incorporated by reference.

FIELD OF THE INVENTION

The present invention relates to the field of semiconductor fabrication, and more particularly, to a semiconductor fabrication method to produce thin semiconductor structures.

BACKGROUND OF THE INVENTION

In a conventional method of producing a flip-chip light emitting diode element, a plurality of epitaxial layers are deposited on a sapphire substrate to produce an epitaxial wafer. On the epitaxial wafer, a plurality of light emitting diode elements are produced. The epitaxial wafer is then diced into dice. The element dice is connected to a fixing plate by connecting at least one electrode of the element dice to at least one pad of the fixing plate.

A thin-GaN light emitting diode element has replaced the flip-chip light emitting diode element, and in comparison to the flip-chip light emitting diode element, thin-GaN light emitting diode element has advantages of a low heat resistance, uniform current in n-type layer and p-type layer, and lower cost. For the thin-GaN light emitting diode element, the epitaxial wafer is directly bonded to a conductive carrier substrate. Then, a laser lift-off process is used to remove the sapphire substrate and leave the active region of the light emitting diode element. However, the laser lift-off method has the disadvantages of requiring expensive equipment and causing processing damage to the light emitting diode elements.

Conventional chemical mechanical polishing (CMP) technology has been used instead of laser lift-off technology, which does not require laser equipment and does not cause similar resulting damage. However, when applying the conventional CMP technology, if the plane being polished is too large, the variation in the thickness of the plane is too great to result in damaging a useful and efficient structure. Therefore, mass production of semiconductor devices cannot be made while maintaining the required production standards.

Therefore, known methods of manufacturing thin semiconductor structures result in undesirable damage and production variations. Accordingly, there is a need for a method of producing thin gallium-nitride (GaN)-based semiconductor structures that overcomes the shortcomings of known methods.

SUMMARY OF THE INVENTION

According to one embodiment of the present invention, a method of making a thin gallium-nitride (GaN)-based semiconductor structure is disclosed. The method includes providing a substrate; sequentially forming one or more semiconductor layers on the substrate; etching a pattern in the one or more semiconductor layers; depositing a dielectrics layer; forming a photoresist on a portion of the dielectrics layer, wherein the portion of the dielectrics layer is deposited on the one or more semiconductor layers; depositing a primer; removing the photoresist layer, wherein the primer on the photoresist is also removed; depositing a superhard material, wherein the superhard material forms in the pattern; and removing the substrate.

According to another embodiment of the present invention, a method of making a thin gallium-nitride (GaN)-based semiconductor structure is disclosed. The method includes providing a sapphire substrate; sequentially forming one or more semiconductor layers on the sapphire substrate, the one or more semiconductor layers including a buffer layer, an undoped GaN layer, n-type GaN layer, an active layer, and a p-type GaN layer; etching a pattern of trenches in the one or more semiconductor layers; depositing a dielectrics layer; forming a photoresist on a portion of the dielectrics layer, wherein the portion of the dielectrics layer is deposited on the one or more semiconductor layers; depositing a primer; removing the photoresist layer, wherein the primer on the photoresist is also removed; depositing a superhard material, wherein the superhard material forms in the trenches; etching to remove the dielectrics layer and expose a p-GaN layer of the one or more semiconductor layers; forming a conductive substrate on the exposed p-GaN layer; removing the sapphire substrate; etching to expose a n-GaN layer of the one or more semiconductor layers; forming an n-electrode on the exposed n-GaN layer.

According to another embodiment of the present invention, a thin gallium-nitride (GaN)-based semiconductor structure is disclosed. The thin GaN-based semiconductor structure includes a sapphire substrate; one or more semiconductor layers formed on the substrate; a plurality of stop points formed in the one or more semiconductor layers; an electrode layer formed on the one or more semiconductor layers; and a conductive substrate bonded to the electrode layer, wherein the conductive substrate is electrically conductive and thermally conductive.

According to another embodiment of the present invention, a vertical gallium-nitride (GaN)-based light emitting diode (LED) is disclosed. The vertical GaN-based LED includes a conductive substrate, wherein the conductive substrate is electrically conductive and thermally conductive; an electrode layer bonded to the conductive substrate; one or more semiconductor layers bonded to the electrode layer, wherein the one or more semiconductor layers including an n-type GaN layer, an active layer, and a p-type GaN layer, and wherein the conductive substrate is bonded to the p-type GaN layer; a plurality of stop points formed in the one or more semiconductor layers; and an n-electrode attached to the n-type GaN layer.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

BRIEF DESCRIPTION OF THE DRAWINGS

FIG. 10A is a cross-sectional view of forming a second electrode to the semiconductor structure shown in FIG. 9A, according to an embodiment of the present invention.

FIG. 10B is a cross-sectional view of forming the second electrode to the semiconductor structure shown in FIG. 9B, according to an embodiment of the present invention.

FIG. 11A is a cross-sectional view of dicing the semiconductor structure light emitting device of FIG. 10A, according to an embodiment of the present invention.

FIG. 11B is a cross-sectional view of cutting the semiconductor structure light emitting device of FIG. 10B, according to an embodiment of the present invention.

DETAILED DESCRIPTION

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive.

Generally, the present invention is directed to a method of making thin gallium-nitride (GaN)-based semiconductor structures that may be used to fabricate light emitting devices. FIGS. 3 to 11B are directed generally a method of making a semiconductor-based light emitting device, according to a first embodiment of the present invention. FIGS. 12 to 27 illustrate the method of making a semiconductor-based light emitting device, according to a second embodiment of the present invention. For example, the semiconductor-based light emitting device is a vertical GaN-based LED. It will be appreciated that the details and description with reference to the second embodiment of the present invention may similarly apply to the first embodiment of the present invention, and vice versa. A vertical GaN-based LED can be made by using an application of the method described with reference to FIGS. 3 to 11B or an application of the method described with reference to FIGS. 12 to 27, or a combination of steps from either or both methods. However, those skilled in the art will appreciate that other methods may be used without departing from the scope of the present invention. While these processes for making a light emitting device are disclosed, it will be appreciated that the method of making a thin semiconductor structure may be used for other applications. The fabrication of a vertical GaN-based LED is, therefore, one example use of embodiments of the present invention.

Throughout the descriptions, use of the prefix "u-" stands for undoped or lightly doped, "p-" stands for p-type or positive, and "n-" stands for n-type or negative.

Figure 1:
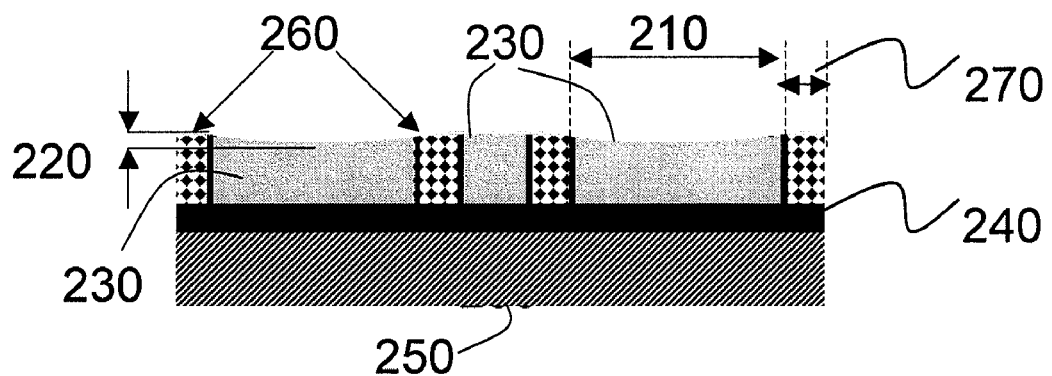
FIG. 1 is a cross-sectional view of a sample semiconductor structure after applying super flat chemical mechanical polishing technology, according to an embodiment of the present invention.

FIG. 1 shows a cross-sectional view of a sample semiconductor structure having a plurality of stop points 260. The semiconductor structure may also be referred to as "the plane" or "the entire plane" as LED are generally manufactured using a semiconductor structure having a planar shape. The semiconductor structure has a distance 210 between two stop points 260, variable V 220, active regions 230, which may be the light emitting surface of an LED, an electrode layer 240, and a carrier 250. Each stop point has a stop point width 270. After using the mechanical thinning method, such as a super flat chemical mechanical polishing method, having had planted a plurality of stop points 260, the variable V of the entire plane can be controlled within standards required in the semiconductor fabricating process.

In a conventional semiconductor structure, when applying a conventional mechanical thinning technology, if the plane to be polished is very large, the variation in the thickness of the layer, shown as variable V in FIG. 1, will be too large for useful, practical application. The variable V is proportional to the distance between the edges of the plane. As shown in FIG. 1, the stop points 260 act as edges of the plane, so that the variable V is reduced, even though the overall size of the plane is larger.

According to one embodiment, the method of creating stop points comprises the following steps: (a) providing a first material for forming a first layer; (b) providing a second material for forming a second layer on a side of the first layer; (c) etching the second layer for producing a plurality of trenches exposing the surface of the first layer; (d) filling the plurality of trenches with a third material that has a hardness greater than the first material and the second material, the filled trenches forming a plurality of polishing stop points; (e) removing any of the third material that lies outside the trenches, and exposing the surface of the second layer. Therefore, the present embodiment allows later removal of the first material while controlling the variable V to be within standards and limits required in the semiconductor fabricating process.

Figure 2:
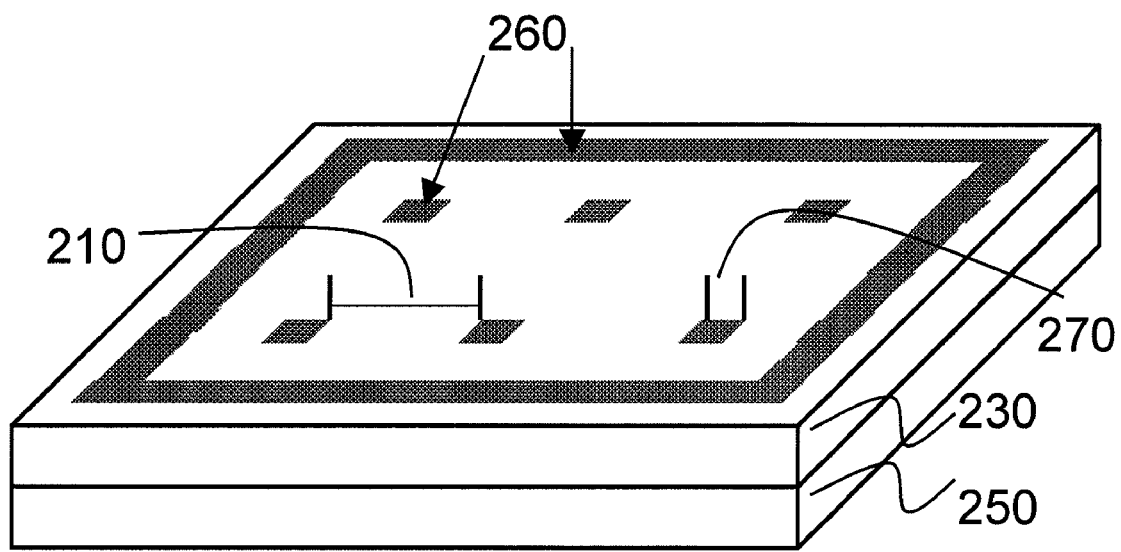
FIG. 2 is an inclined top view of a stop point distribution in the sample semiconductor structure, according to an embodiment of the present invention.

FIG. 2 shows an inclined top view of a stop point distribution, according to one embodiment the present invention. As described above, the variable V can be reduced by using stop points. Therefore, a variable V within an acceptable range can be obtained by controlling sizes of the stop points and/or the distance between the stop points. While the stop points are shown in FIG. 2 as generally square or in the form of perimeter lines, the stop points in the present invention can be any shape, such as lines, dots, circles, triangles, or rectangles, and may be located in any suitable positions on the plane.

Figure 3:
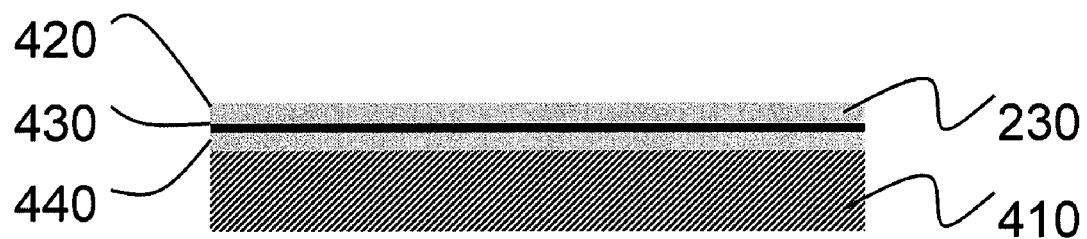
FIG. 3 is a cross-sectional view of a semiconductor structure, according to an embodiment of the present invention.
Figure 4:
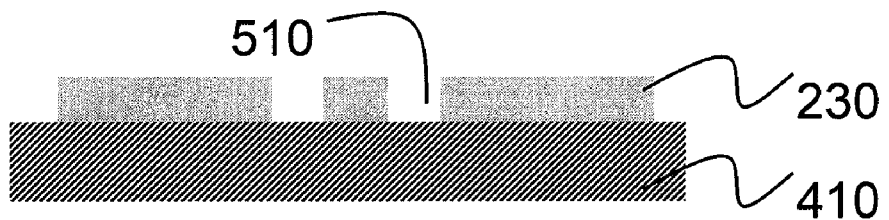
FIG. 4 is a cross-sectional view of the semiconductor structure after etching, according to an embodiment of the present invention.
Figure 5:
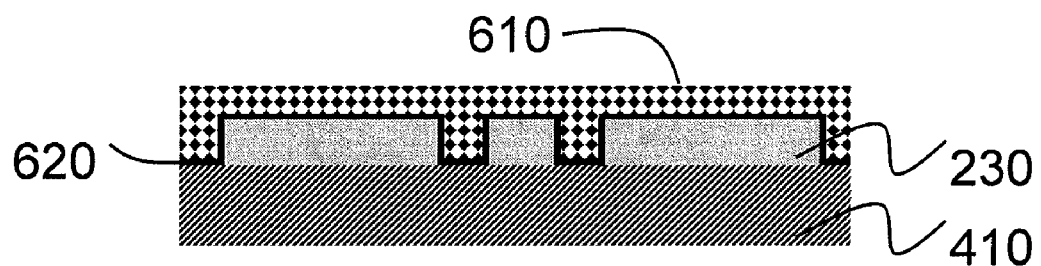
FIG. 5 is a cross-sectional view of the semiconductor structure after being covered with diamond film, according to an embodiment of the present invention.
Figure 6:
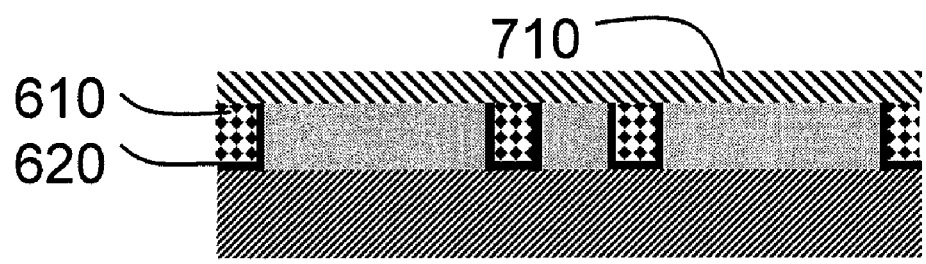
FIG. 6 is a cross-sectional view of the semiconductor structure after forming a first electrode layer, according to an embodiment of the present invention.
Figure 7:
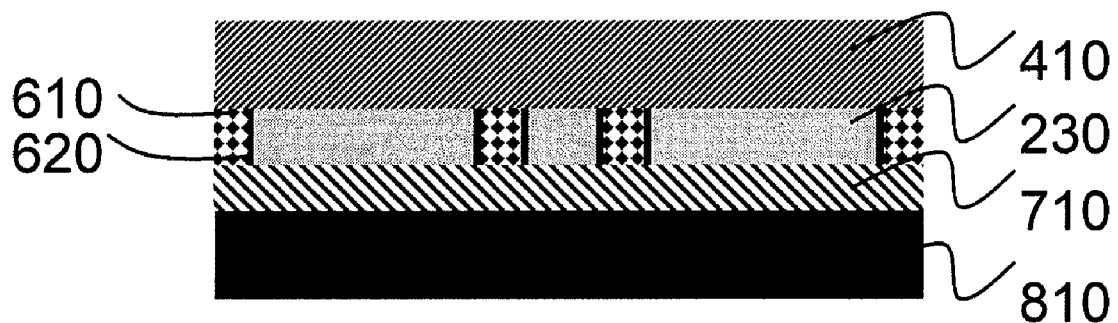
FIG. 7 is a cross-sectional view of the semiconductor structure after bonding a conductive carrier to the first electrode layer, according to an embodiment of the present invention.
Figure 8:
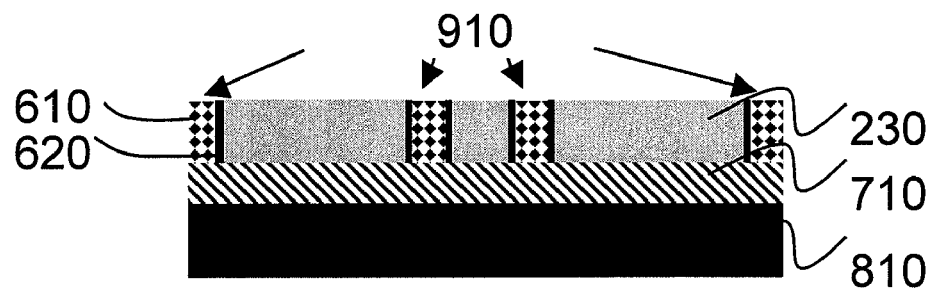
FIG. 8 is a cross-sectional view of the semiconductor structure after mechanical thinning process, according to an embodiment of the present invention.
Figures 9A, 9B:
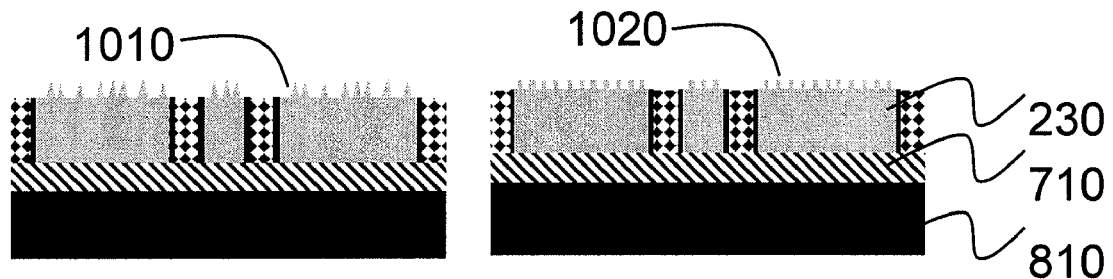
FIG. 9A is a cross-sectional view of the semiconductor structure after roughening a top light emitting area, according to an embodiment of the present invention.
FIG. 9B is a cross-sectional view of the semiconductor structure after forming a two-dimensional photonic crystal on the top light emitting area, according to an embodiment of the present invention.

An application of the present invention, according to an embodiment, is disclosed in FIGS. 3 to 11B, which is a method of fabricating a film semiconductor light emitting device. The method comprises the following steps: (a) providing a first material for forming a first layer 410; (b) providing a second material of a semiconductor material, for forming a second layer 230 acting as an active region on a side of the first layer (as shown in FIG. 3, the second material may include multiple layers, for example one or more p-GaN layers 420, an active layer having multiple quantum wells 430, and one or more n-GaN layers 440); (c) etching the second layer for producing a plurality of trenches 510 and exposing surfaces of the first layer (as shown in FIG. 4); (d) covering a layer medium 620; (e) adding a third material 610, which has hardness greater than the first material and the second material, which also fills in the trenches to form a plurality of stop points (as shown in FIG. 5); (f) removing the third material 610 and the layer medium 620, removing the third material in areas outside of the trenches so that only the stop points 910 (shown in FIG. 8) remain, and providing a fourth material for forming a first electrode layer 710 on surfaces of the second layer (as shown in FIG. 6); (g) bonding the first electrode layer on a conductive carrier 810 (as shown in FIG. 7); (h) removing the first layer exposing a plurality of stop points 910 (as shown in FIG. 8); and (i) forming a plurality of second electrodes 1110 on surfaces of the second material after removing the first layer (as shown in FIG. 10). The present embodiment further comprises roughening the light emitting surfaces 1010 as in FIG. 9A or forming two-dimensional photonic crystal 1020 on the light emitting surfaces as in FIG. 9B. Finally, as shown in FIG. 11A or FIG. 11B, dicing to form the light emitting device can be performed.

In the embodiment described above, the first material may be sapphire, silicon, AlN, SiC, GaAs or GaP; the second material can be GaN or GaInN, the second material semiconductor material of Group III-V; the etching in step (c) may be inductively coupled plasma etching; wherein the third material can be diamond film or diamond-like carbon (DLC) film; the removing in step (h) may be by a mechanical thinning method; the first electrode layer is p-type and the second electrode layer is n-type. An embodiment of the present invention is a diamond shoulder light emitting diode referred to by reference number 1210.

The semiconductor device structure produced according to embodiments of the present invention comprises: a conductive carrier; a semiconductor material layer; a superhard material, wherein the superhard material has at least a surface adjacent to the semiconductor material layer; a first electrode layer located on a first surface of the semiconductor material layer; and a second electrode layer located on a second surface of the semiconductor material layer opposing the first electrode layer. The semiconductor material layer, for example, may be one of InGaP, AlInGaN, AlInGaP, AlGaAs, GaAsP, InGaAsP, or other suitable materials. The superhard material may be, for example, diamond, diamond-like carbon (DLC), titanium nitride (TiNx), titanium tungsten (TiWx) alloy, or other suitable materials. The conductive carrier may be, for example, copper, silicon, silicon carbide, gallium arsenide (GaAs), or other similar materials.

Figure 12:
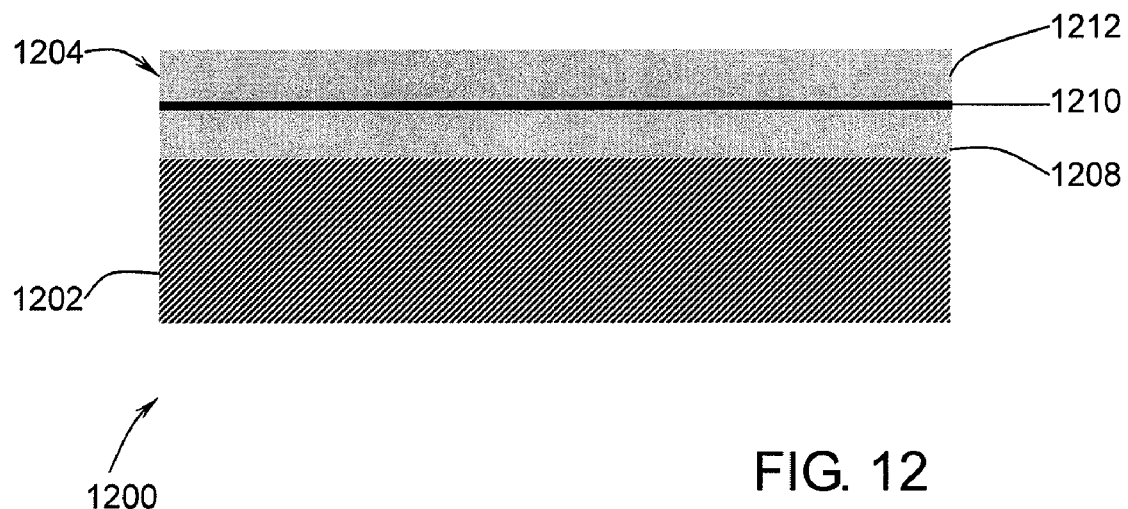
FIG. 12 is a cross-sectional view of a semiconductor structure, according to an embodiment of the present invention.

FIG. 12 is a cross-sectional view of a semiconductor structure, according to an embodiment of the present invention. The cross-sectional view of the semiconductor structure 1200 shows a sapphire substrate 1202 and a semiconductor layer 1204 grown on the sapphire substrate 1202. For example, the semiconductor layer 1204 may be an InGaN layer as shown in FIG. 12 having an n-type GaN layer (n-GaN) 1208, an active layer 1210 having a multiple quantum well (MQW) structure, for example, and a p-type GaN (p-GaN) layer 1212. However, in FIG. 13 to FIG. 27, only the semiconductor layer 1204 is shown for simplicity. However, it should be appreciated that any desired layer, including one or more layers, may be grown on the substrate as desired, in accordance with embodiments of the present invention.

Generally, the n-GaN layer 1208 and the active layer 1210 are grown on the semiconductor substrate 1202. Other layers may first be grown on the semiconductor substrate 1202 first, depending on the application and design of the semiconductor structure 1200. Then, one or more p-GaN layers 1212 are grown on the active layer 1210. According to embodiments of the present invention, the n-GaN layer may includes an undoped buffer layer grown on the sapphire substrate 1202 that is not shown in the figures. The n-GaN layer may then be grown on the undoped buffer layer.

Figure 13:
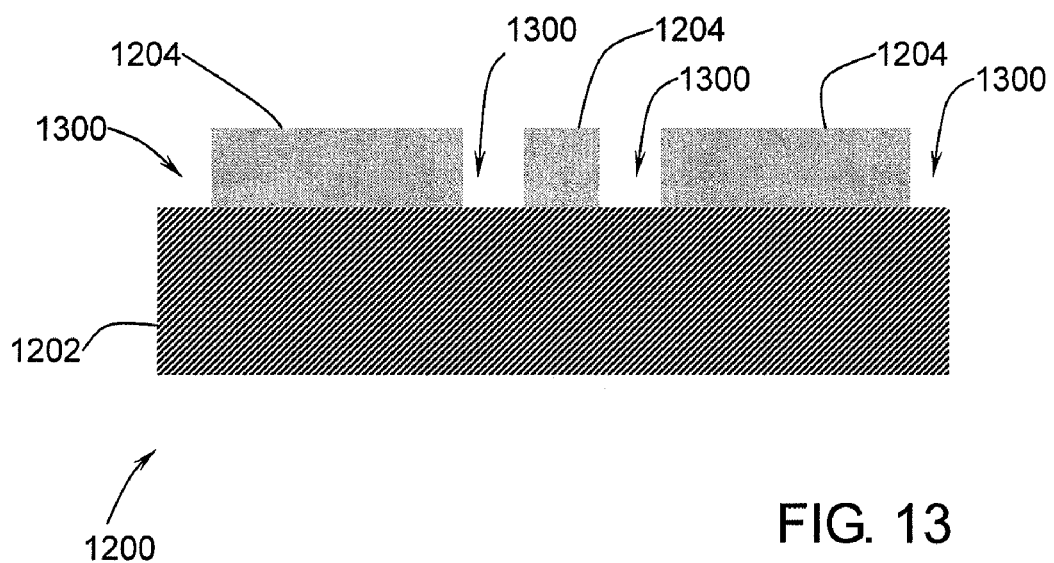
FIG. 13 is a cross-sectional view of a semiconductor structure, according to an embodiment of the present invention.
Figure 14:
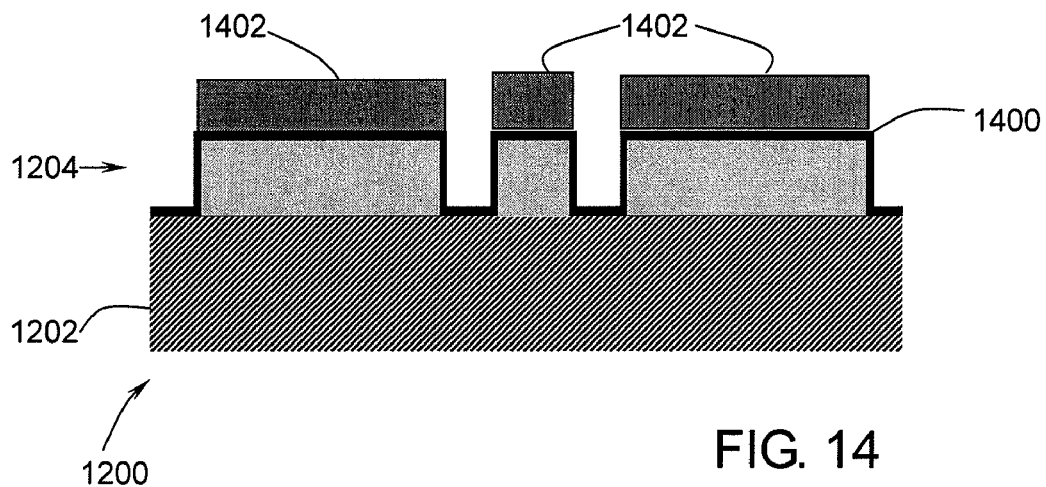
FIG. 14 is a cross-sectional view of a semiconductor structure, according to an embodiment of the present invention.

FIG. 13 is a cross-sectional view of a semiconductor structure, according to an embodiment of the present invention. Etching is performed to create a pattern 1300 in the in the semiconductor layer 1204 exposing the sapphire substrate 1202. In one embodiment, the pattern 1300 may take the form of trenches, which may be formed by mesa isolation or other suitable etching methods. The pattern may take the shape of trenches, points, holes, dots, lines, or any other desired shape. Other methods and techniques for creating the pattern 1300 will be appreciated by those of skill in the field.

In FIGS. 14 to 17, the pattern 1300 is then filed will a superhard material using a selective deposition process. A protective dielectrics layer 1400 is deposited on the semiconductor layer 1204 and the exposed surfaces of the sapphire substrate 1202. A photoresist 1402 is patterned on the semiconductor layer 1204.

Figure 15:
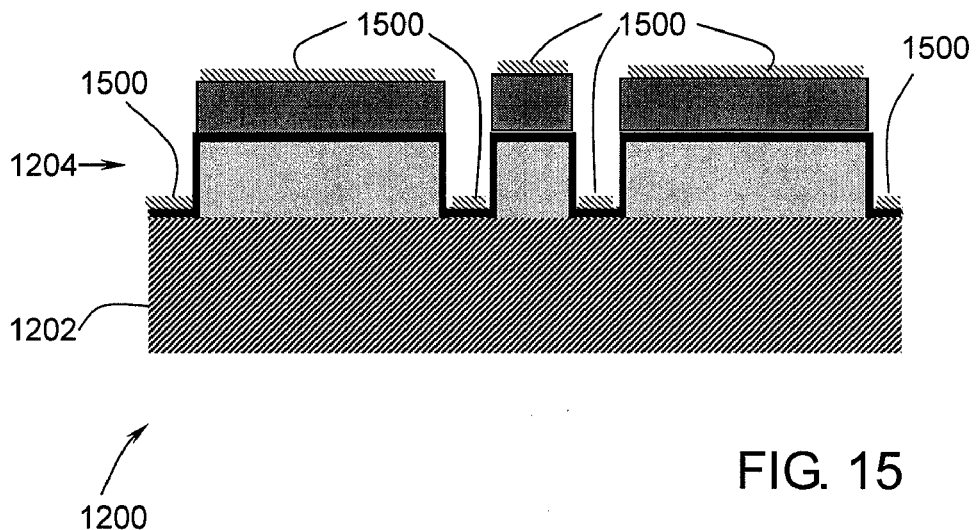
FIG. 15 is a cross-sectional view of a semiconductor structure, according to an embodiment of the present invention.

Referring to FIG. 15, a primer 1500 is applied to the semiconductor structure 1200, which covers both the photoresist 1402 and the dielectrics layer 1400. Adding the primer 1500 is part of a seeding process and is one step in forming the superhard material in the pattern 1300. One example of the primer 1500 is a diamond powder. The diamond powder may be, for example, between 3 to 6 microns in size.

Figure 16:
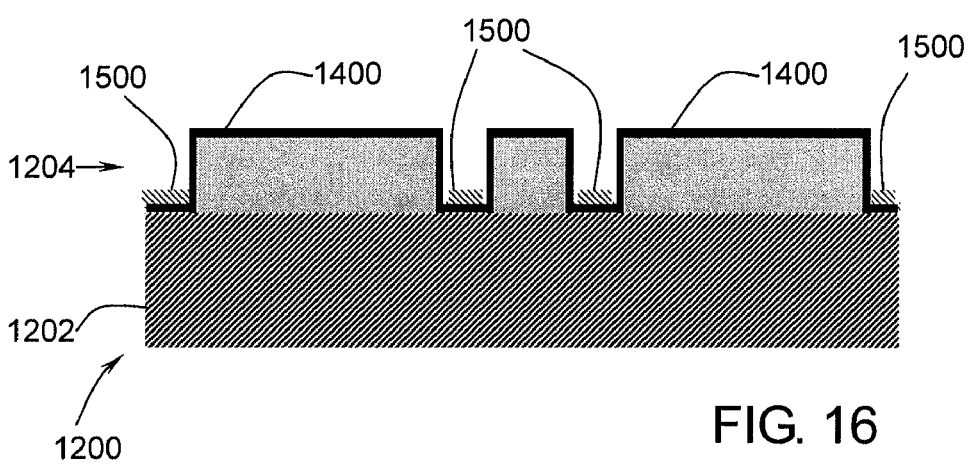
FIG. 16 is a cross-sectional view of a semiconductor structure, according to an embodiment of the present invention.

Referring to FIG. 16, the photoresist 1402 is removed. In addition, the primer 1500 that was located on the photoresist 1402 is removed with the photoresist 1402. Therefore, the portion of the dielectrics layer 1400 on the semiconductor layer 1204 is without the primer 1500 that is needed for the deposition of the superhard material.

Figure 17:
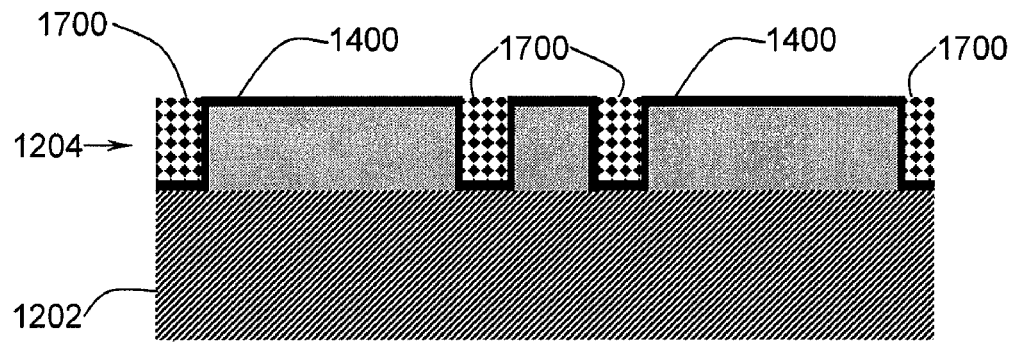
FIG. 17 is a cross-sectional view of a semiconductor structure, according to an embodiment of the present invention.

Referring to FIG. 17, the superhard material 1700 is formed in the pattern 1300. Because the primer 1500 was only located on the portion of the dielectrics layer that is located in the pattern 1300, the superhard material 1700 formed only in these areas. Therefore, the superhard material 1700 is selectively deposited based at least partially on the location of the primer 1500. Since there was no primer on the portion of the dielectrics material that is on the semiconductor layer 1204, the superhard material 1700 did not form on these areas.

Figure 18:
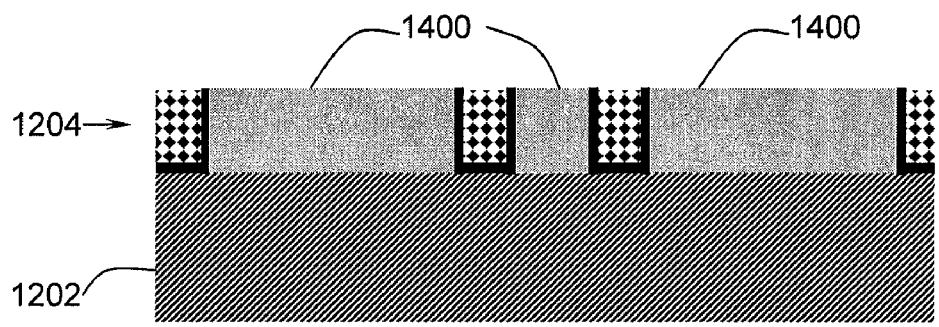
FIG. 18 is a cross-sectional view of a semiconductor structure, according to an embodiment of the present invention.
Figure 19:
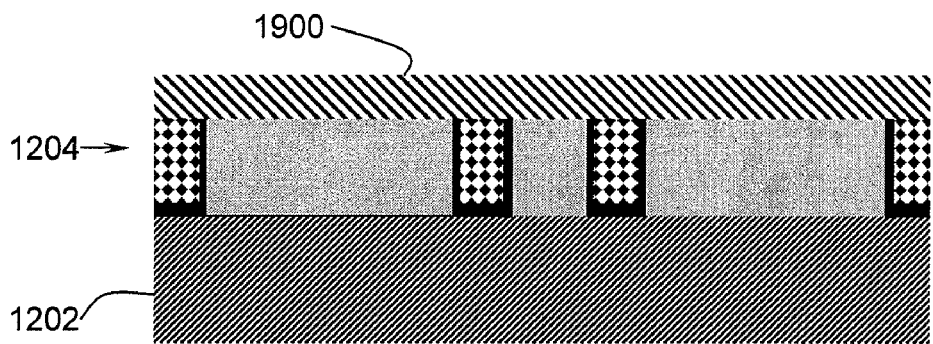
FIG. 19 is a cross-sectional view of a semiconductor structure, according to an embodiment of the present invention.
Figure 20:
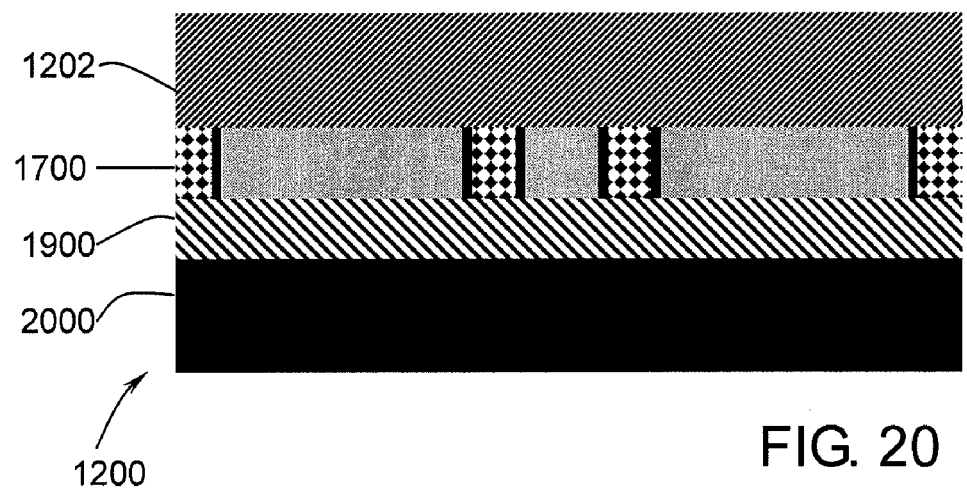
FIG. 20 is a cross-sectional view of a semiconductor structure, according to an embodiment of the present invention.

Referring to FIG. 18, the dielectrics layer 1400 on the semiconductor layer 1204 is removed to expose the p-GaN layer of the semiconductor layer 1204. Referring to FIG. 19, with p-type metallization, a first electrode layer 1900 is formed on the surface of the semiconductor layer 1204 and the superhard material 1700. The first electrode layer 1900 may be the Ohmic contact and mirror layers. Referring now to FIG. 20, compared to the view of FIG. 19, the image has been rotated 180° such that the sapphire substrate 1202 now appears at the upper part of the figure. The first electrode layer 1900 is bonded onto a conductive carrier 2000. According to one embodiment, the conductive carrier 2000 may include copper, silver, gold, silicon, silicon carbide, or GaAs.

Figure 21:
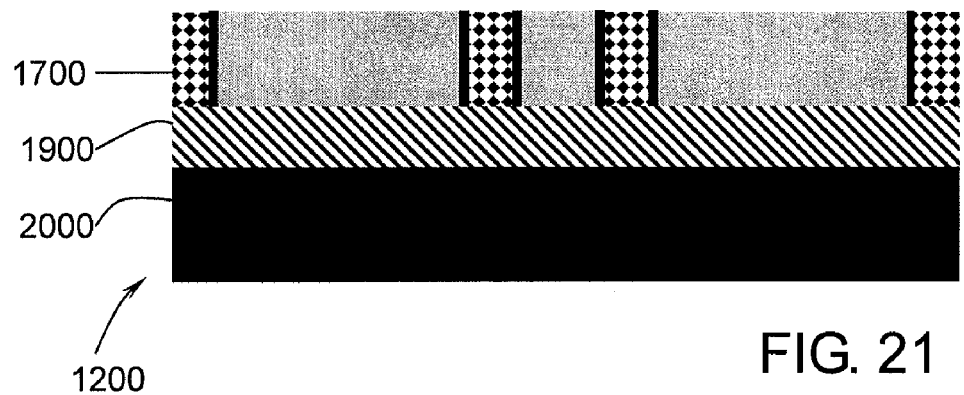
FIG. 21 is a cross-sectional view of a semiconductor structure, according to an embodiment of the present invention.

FIG. 21 is a cross-sectional view of a semiconductor structure, according to an embodiment of the present invention. FIG. 21 shows the sapphire substrate 1202 having been removed. In one embodiment, the sapphire substrate 1202 is removed by a mechanical thinning process, which generally may include grinding, lapping, polishing or chemical mechanical polishing of the surface as part of the process. In one embodiment, a combination of grinding, lapping and CMP is used to remove the sapphire substrate 1202. Other removal methods may be used. However, using a mechanical thinning method in combination with embodiments of the present invention provides added advantages of speed and accuracy. The removal of the sapphire substrate 1202 exposes the superhard material 1700. The superhard material 1700, being a harder material than the sapphire substrate 1202, serve as stop points to indicate when the mechanical thinning process is stopped. As the stop points are formed from a superhard material, mechanical thinning can be stopped with certainty and precision at the location of the stop points ends, leaving the remaining semiconductor layers. The superhard material may be any suitable material harder than the sapphire substrate and the GaN layer. Examples of suitable superhard material are provided with reference to FIGS. 3 to 11B. However, the term "superhard" is not meant to be limited to the examples given but may be any type of material suitable for accomplishing the described method.

Figure 22:
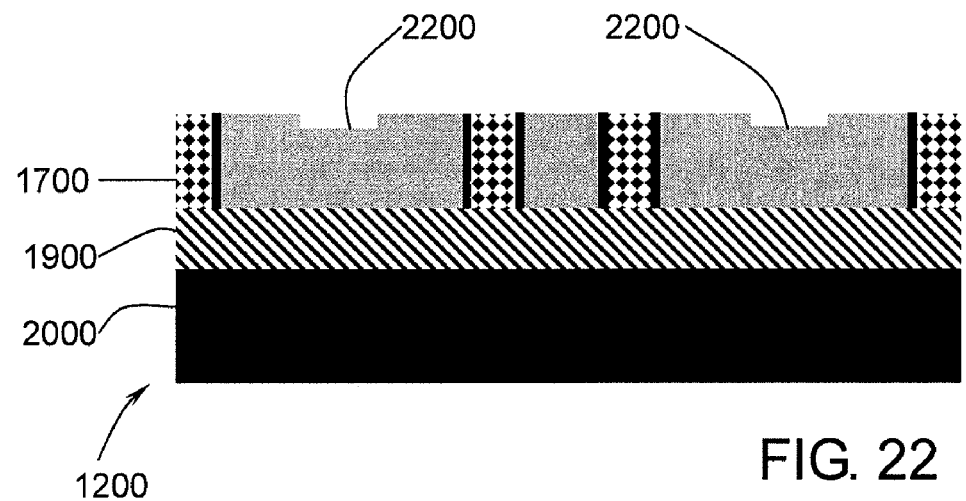
FIG. 22 is a cross-sectional view of a semiconductor structure, according to an embodiment of the present invention.
Figure 23:
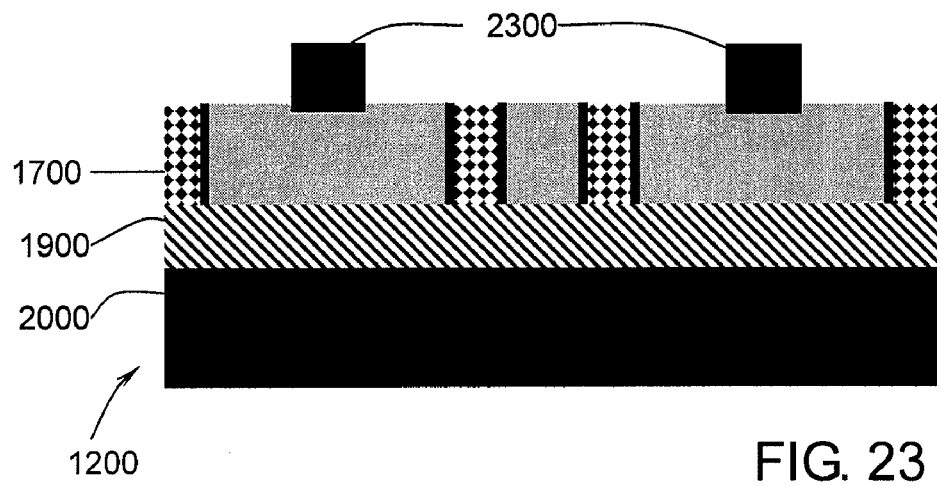
FIG. 23 is a cross-sectional view of a semiconductor structure, according to an embodiment of the present invention.

Referring to FIG. 22, an undoped buffer layer of the semiconductor layer 1204 is etched to expose the n-GaN layer 2200. Referring to FIG. 23, electrodes 2300 are formed on the exposed n-GaN layer 2200.

Figure 24:
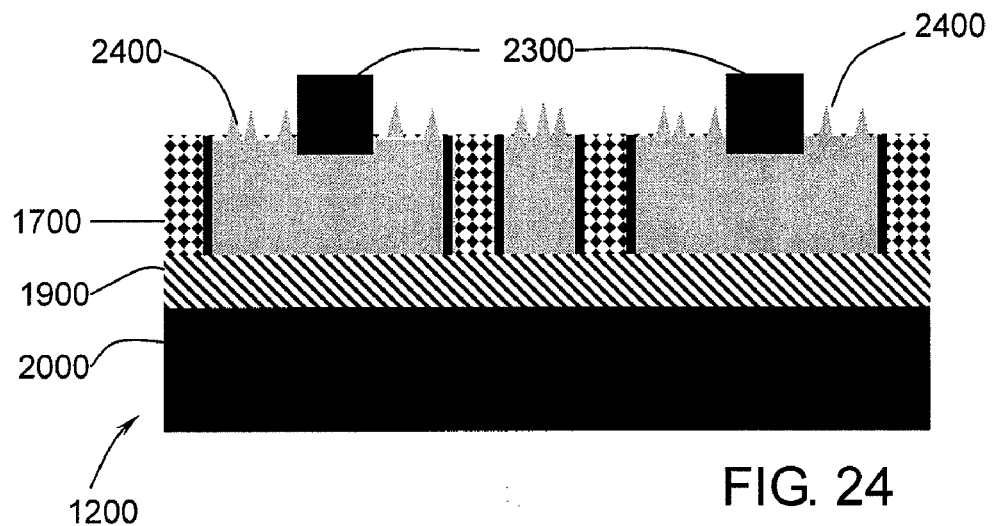
FIG. 24 is a cross-sectional view of a semiconductor structure, according to an embodiment of the present invention.

According to one embodiment of the present invention, as shown in FIG. 24, surface texturing 2400 or roughening of the light emitting surface may be performed. According to another embodiment, as shown in FIG. 25, forming two-dimensional photonic crystal 2500 on the light emitting surfaces may also be performed.

Figure 26:
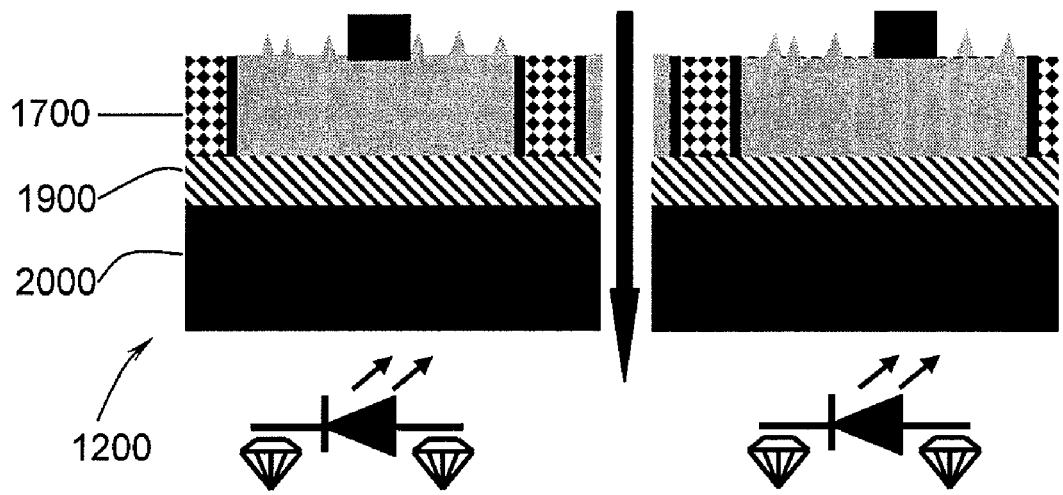
FIG. 26 is a cross-sectional view of a semiconductor structure, according to an embodiment of the present invention.

FIG. 26 is a cross-sectional view of the semiconductor structure shown in FIG. 24, according to an embodiment of the present invention.

Figure 25:
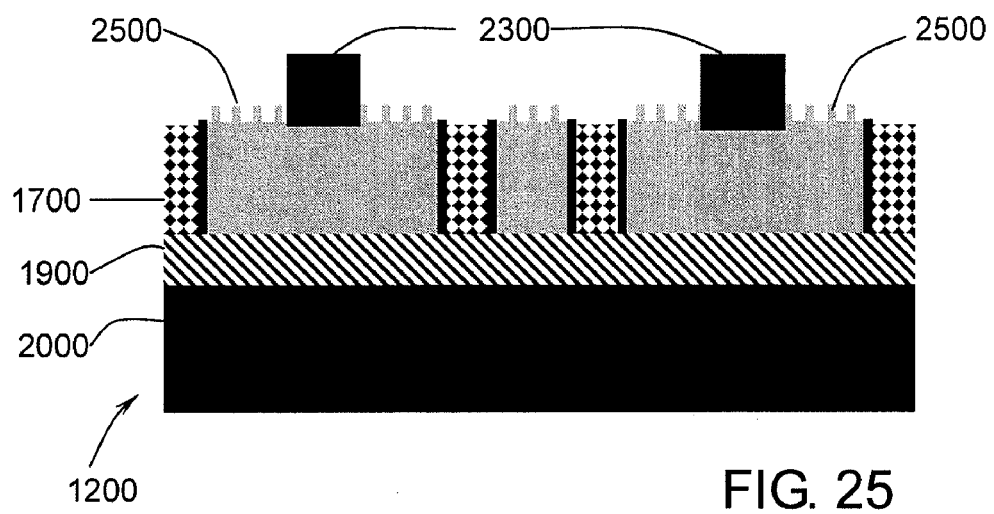
FIG. 25 is a cross-sectional view of a semiconductor structure, according to an embodiment of the present invention.
Figure 27:
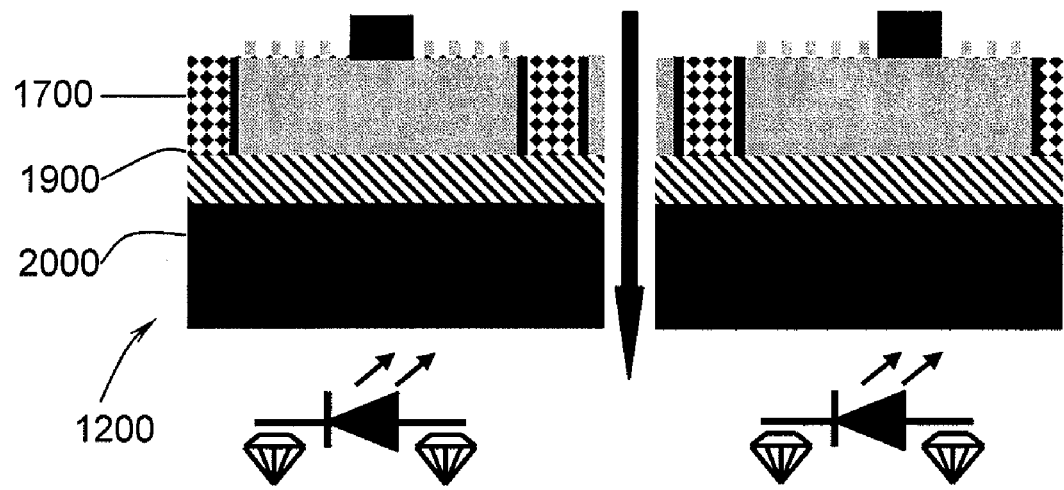
FIG. 27 is a cross-sectional view of a semiconductor structure, according to an embodiment of the present invention.

FIG. 27 is a cross-sectional view of the semiconductor structure shown in FIG. 25, according to an embodiment of the present invention.

While the invention has been particularly shown and described with reference to the illustrated embodiments, those skilled in the art will understand that changes in form and detail may be made without departing from the spirit and scope of the invention. For example, while certain etching methods have been described, any suitable etching methods may be used with embodiment of the present invention such as, for example, wet etching, dry etching, ICP etching, PEC etching, or other suitable methods. For example, in one embodiment, highly selective wet etching will be used; however dry etching and other suitable etching methods as known by those of skill in the field may also be used.

Accordingly, the above description is intended to provide example embodiments of the present invention, and the scope of the present invention is not to be limited by the specific examples provided.

What is claimed is:

1. A method of making a thin gallium-nitride (GaN)-based semiconductor structure, the method comprising:
   providing a substrate;
   sequentially forming one or more semiconductor layers on the substrate;
   etching a pattern in the one or more semiconductor layers;
   depositing a dielectrics layer;
   forming a photoresist on a portion of the dielectrics layer, wherein the portion of the dielectrics layer is deposited on the one or more semiconductor layers;
   depositing a primer;
   removing the photoresist layer, wherein the primer on the photoresist is also removed;
   depositing a superhard material, wherein the superhard material forms in the pattern; and
   removing the substrate.

2. The method of claim 1, wherein the substrate is removed using mechanical thinning.

3. The method of claim 1, wherein the substrate is removed using a combination of grinding, lapping, and chemical mechanical polishing (CMP).

4. The method of claim 1, wherein the one or more semiconductor layers includes an n-type GaN layer, an active layer, and a p-type GaN layer.

5. The method of claim 1, wherein the one or more semiconductor layers further includes an undoped buffer layer, the undoped buffer layer grown on the sapphire substrate, and wherein the n-type GaN layer is grown on the undoped buffer layer.

6. The method of claim 1, further comprising:
   etching to remove the dielectrics layer and expose a p-GaN layer of the one or more semiconductor layers;
   forming an electrically and thermally conductive substrate on the exposed p-GaN layer;
   etching to expose a n-GaN layer of the one or more semiconductor layers;
   forming an n-electrode on the exposed n-GaN layer; and
   dicing the semiconductor structure to form a plurality of light emitting devices.

7. The method of claim 1, further comprising providing a plurality of stop points having a hardness greater than a hardness of the substrate.

8. A method of making a thin gallium-nitride (GaN)-based semiconductor structure, the method comprising:
- providing a sapphire substrate;
- sequentially forming one or more semiconductor layers on the sapphire substrate, the one or more semiconductor layers including an n-type GaN layer, an active layer, and a p-type GaN layer;
- etching a pattern of trenches in the one or more semiconductor layers;
- depositing a dielectrics layer;
- forming a photoresist on a portion of the dielectrics layer, wherein the portion of the dielectrics layer is deposited on the one or more semiconductor layers;
- depositing a primer;
- removing the photoresist layer, wherein the primer on the photoresist is also removed;
- depositing a superhard material, wherein the superhard material forms in the trenches;
- etching to remove the dielectrics layer and expose a p-GaN layer of the one or more semiconductor layers;
- forming a conductive substrate on the exposed p-GaN layer;
- removing the sapphire substrate;
- etching to expose a n-GaN layer of the one or more semiconductor layers;
- forming an n-electrode on the exposed n-GaN layer.

9. The method of claim 8, wherein the one or more semiconductor layers further includes an undoped buffer layer, the undoped buffer layer grown on the sapphire substrate, and wherein the n-type GaN layer is grown on the undoped buffer layer.

10. The method of claim 8, wherein the conductive substrate is electrically conductive and thermally conductive.

11. The method of claim 8, wherein the sapphire substrate is removed using mechanical thinning.

12. The method of claim 8, wherein the sapphire substrate is removed using a combination of grinding, lapping, and chemical mechanical polishing (CMP).

13. The method of claim 8, wherein the one or more semiconductor layers includes an active layer.

14. The method of claim 8, further comprising providing a plurality of stop points having a hardness greater than a hardness of the substrate.

15. The method of claim 8, further comprising:
- surface texturing a light emitting surface of the one or more semiconductor layers; and
- dicing the semiconductor structure to form a plurality of light emitting devices.

16. The method of claim 8, further comprising:
- forming two-dimensional photonic crystal on a light emitting surfaces of the one or more semiconductor layers; and
- dicing the semiconductor structure to form a plurality of light emitting devices.

* * * * *